United States Patent
Huang et al.

(10) Patent No.: US 9,836,572 B2
(45) Date of Patent: Dec. 5, 2017

(54) INCREMENTAL COMMON PATH PESSIMISM ANALYSIS

(71) Applicant: International Business Machines Corporation, Armonk, NY (US)

(72) Inventors: Tsung-Wei Huang, Savoy, IL (US); Kerim Kalafala, Rhinebeck, NY (US); Vasant B. Rao, Fishkill, NY (US); Debjit Sinha, Wappingers Falls, NY (US); Natesan Venkateswaran, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/946,043

(22) Filed: Nov. 19, 2015

(65) Prior Publication Data

US 2017/0147737 A1 May 25, 2017

(51) Int. Cl.
*G06F 17/50* (2006.01)

(52) U.S. Cl.
CPC ...... *G06F 17/5081* (2013.01); *G06F 17/5031* (2013.01); *G06F 17/5045* (2013.01)

(58) Field of Classification Search
CPC ............. G06F 17/5031; G06F 17/5081; G06F 2217/84
See application file for complete search history.

(56) References Cited

U.S. PATENT DOCUMENTS

| | | | |
|---|---|---|---|
| 7,398,491 B2 | 7/2008 | Schaeffer et al. | |
| 8,122,404 B2 | 2/2012 | Sinha et al. | |
| 8,239,798 B1 | 8/2012 | Goyal et al. | |
| 8,381,150 B2 | 2/2013 | Zolotov et al. | |
| 8,572,532 B1 | 10/2013 | Singh et al. | |
| 8,578,310 B2 | 11/2013 | Kalafala et al. | |
| 8,788,995 B1 | 7/2014 | Kumar et al. | |
| 8,938,703 B1 | 1/2015 | Saurabh et al. | |

(Continued)

OTHER PUBLICATIONS

Lee et al., "iTimerC 2.0: Fast incremental timing and CPPR analysis". 2015 IEEE?ACM International Conference on Computer-Aided Design, Nov. 2-6, 2015, pp. 890-894.*

(Continued)

*Primary Examiner* — Jack Chiang
*Assistant Examiner* — Aric Lin
(74) *Attorney, Agent, or Firm* — Cantor Colburn LLP; Steven Meyers

(57) ABSTRACT

A method, system, and computer program product for performing incremental common path pessimism analysis in integrated circuit design includes performing common path pessimism removal (CPPR) analysis to provide timing credit for one or more paths that are subject to common path pessimism. The method also includes identifying one or more post-CPPR critical paths based on the CPPR analysis, setting flags for critical nodes of the one or more post-CPPR critical paths, performing a design fix to address the one or more post-CPPR critical paths, and applying a set of rules based on the design fix and the flags to identify seed points among the critical nodes of the one or more post-CPPR critical paths. Invalidating and re-performing the CPPR analysis is done only for paths associated with the seed points.

17 Claims, 5 Drawing Sheets

(56) References Cited

U.S. PATENT DOCUMENTS

2012/0284680 A1* 11/2012 Iyer .................... G06F 17/5031
 716/113
2014/0149956 A1 5/2014 Fluhr et al.

OTHER PUBLICATIONS

Chen et al., "Static Timing: Back to Our Roots", Design Automation Conference, 2008, pp. 310-315.
Visweswariah et al., "First-Order Incremental Block-Based Statistical Timing Analysis", IEEE Transactions on Computer-Aided Design of Integrated Circuits and Systems, vol. 25, No. 10, Oct. 2006, pp. 2170-2180.

* cited by examiner

INCREMENTAL COMMON PATH PESSIMISM ANALYSIS

BACKGROUND

The present invention relates to static timing analysis of an integrated circuit design, and more specifically, to incremental common path pessimism analysis.

Timing analysis is performed during the various stages of digital integrated circuit (IC) or chip design to ensure that the end product will meet all timing requirements. A chip design is modeled as a timing graph with gate- and wire-pins denoted by timing nodes. Each connection from an input pin (source node) to an output pin (sink node) is denoted by a directed timing edge in the graph. Generally, timing analysis involves calculating delay through the edges or paths between a chip input and a chip output to determine the speed of propagation of signal transitions at different components (e.g., gates, wires, latches) of the chip. Generally, arrival time at a given point refers to either the latest (in LATE mode) or earliest (in EARLY mode) time at which the voltage at the point reaches half of the maximum voltage. To account for on-chip and environmental variations (e.g., temperature, battery level), statistical static timing analysis (SSTA) or another technique may be used to express arrival time as a range given by {early mode arrival time, late mode arrival time}. Many known tests (e.g., setup test, hold test) may be performed as part of the timing analysis. The tests examine the worst-case scenario in most cases. Thus, for example, the setup test determines if the late mode arrival time at the input of a data node of a device occurs before the early mode arrival time at the clock node so that the data is captured correctly. The issue of pessimism arises in timing analysis tests when early mode and late mode is considered for the same edge (path). For example, in the setup test example, if the data input and clock input shared an edge (a path segment), the test uses late mode arrival time with respect to the data input, which considers late mode delay through that edge, as well as early mode arrival time with respect to the clock input, which considers early mode delay through that same edge. This is referred to as common path pessimism (CPP). Common path pessimism removal (CPPR) is a technique for adjusting timing slack (crediting some time back to the edge) to account for the CPP associated with the edge.

SUMMARY

Embodiments include a method, system, and computer program product to perform incremental common path pessimism analysis in integrated circuit design. Aspects include performing, using a processor, common path pessimism removal (CPPR) analysis to provide timing credit for one or more paths that are subject to common path pessimism; identifying one or more post-CPPR critical paths based on the CPPR analysis; setting flags for critical nodes of the one or more post-CPPR critical paths; performing a design fix to address the one or more post-CPPR critical paths; applying a set of rules based on the design fix and the flags to identify seed points among the critical nodes of the one or more post-CPPR critical paths; and invalidating and re-performing the CPPR analysis only for paths associated with the seed points.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, CPPR is performed to adjust timing slack to account for CPP. Specifically, some positive timing slack is credited to the common path (edge that interconnects nodes) that gives rise to CPP to account for the pessimism associated with considering both early mode and late mode delay through that path. Among all such paths leading to a given test, the path(s) with the minimum post-CPPR adjusted path slack (the path(s) least improved by CPPR) determine the final test slack and adjust. In the forgoing discussion, such a path is referred to as the "post CPPR critical path". Once CPPR has been performed on all common paths, if the test (e.g., setup test) is still failing, a fixup process may be performed. The fixup refers to design changes (e.g., resizing power, rerouting a network, adding a buffer) that may be performed. This fixup process is performed incrementally as needed. Currently, when an iteration of the fixup process has been completed (one design change or set of design changes has been implemented), tests associated with all downstream paths are invalidated and all downstream CPPR results are re-analyzed. However, recalculation of CPPR adjustment is not necessary for all downstream paths affected by CPP, because some of those paths may not affect the invalidated tests at all. In those cases, the re-calculation is inefficient and costly. Embodiments of the systems and methods detailed herein relate to approaching incremental common path pessimism analysis in a more discerning manner to avoid the inefficiency.

Figure 1:
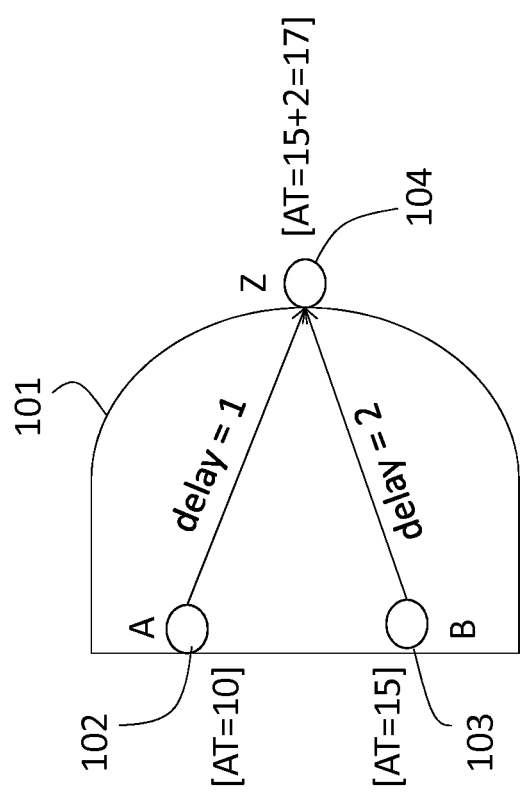
FIG. 1 shows an exemplary scenario for application of the embodiments.

FIG. 1 shows an exemplary scenario for application of the embodiments detailed herein. Only late mode values are discussed with reference to FIG. 1 and the exemplary scenario for simplicity, but an analogous situation applies for early mode values, as well. As FIG. 1 indicates, the arrival time (AT) at node A 102 is 10, and the arrival time at node B 103 is 15. Nodes A 102 and B 103 of the component 101 both feed node Z 104, but the arrival time at node Z 104 is the maximum of the arrival time propagated from node A 102 or node B 103. If a fix (e.g., addition of a buffer) upstream of node A 102 changed the arrival time at node A 102 from 10 to 12, for example, this change would have no effect on node Z 104. This is because, unless the arrival time at node A 102 exceeds 17 (such that 17+1 (delay)=18 and exceeds the current maximum of 17), the maximum arrival time at node Z 104 would still originate from node B 103 rather than from node A 102. As such, even if a fix upstream of node A 102 changed the arrival time at node A 102 from 10 to 12, a re-analysis of CPPR is only needed at a test downstream of node A 102 if the node where a change occurred, e.g., A 102, is on a critical post-CPPR path leading to at least one test downstream of node A 102. Embodiments further detailed below relate to seeding the CPPR invalidation queue and invalidating or re-calculating CPPR adjustment values only according to the seed points.

Figure 2:
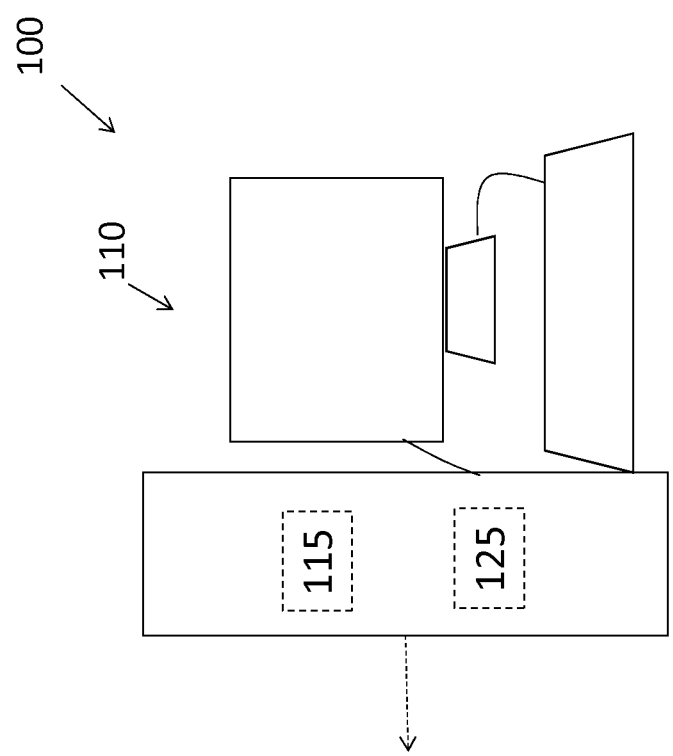
FIG. 2 is a block diagram of a system according to embodiments.
Figure 2:
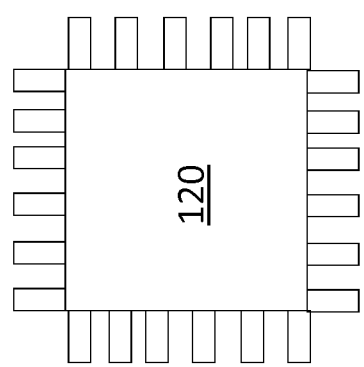

FIG. 2 is a block diagram of a system 100 according to embodiments of the invention. The system 100 includes a processing system 110 used to design an integrated circuit and the resulting physical implementation of the integrated circuit 120. The system 100 includes additional known components that perform functions such as, for example, obtaining measurements from the integrated circuit 120 that are provided to the processing system 110 as needed. The processing system 110 includes one or more memory devices 115 and one or more processors 125. The memory device 115 stores instructions implemented by the processor 125. As further discussed below, these instructions include processes used to perform incremental common path pessimism analysis. According to the embodiments detailed below, the memory device 115 may additionally store the rules used to identify seed points discussed below.

Figure 3:
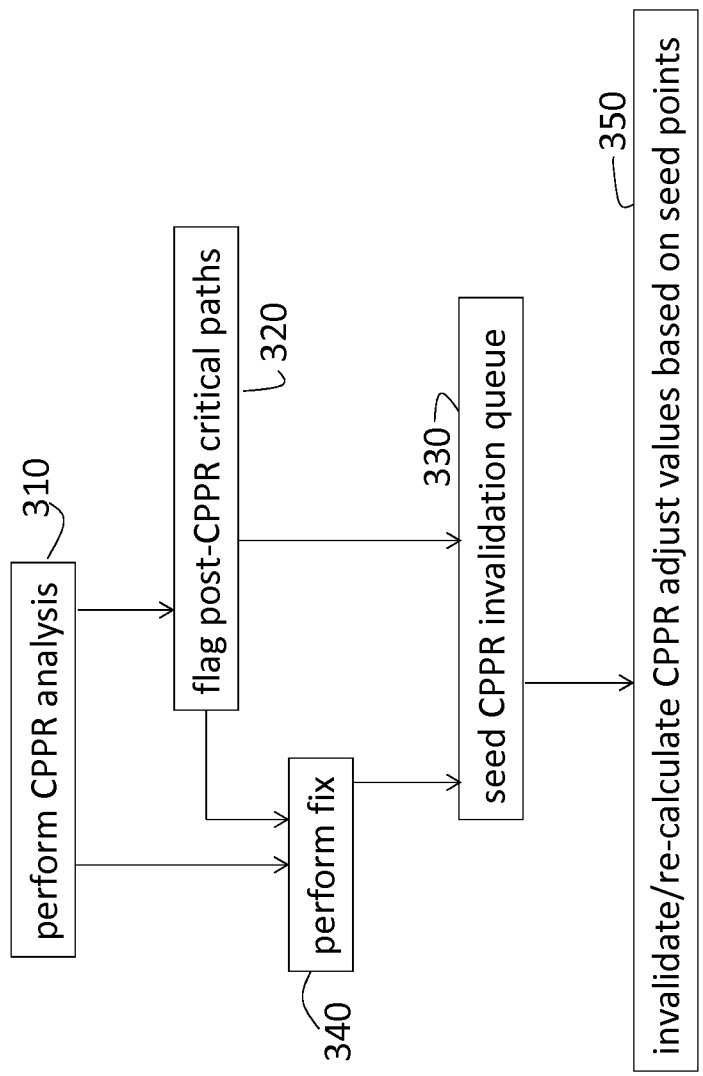
FIG. 3 is a process flow of a method of performing incremental common path pessimism analysis according to embodiments.

FIG. 3 is a process flow of a method of performing incremental common path pessimism analysis according to embodiments. At block 310, performing CPPR analysis includes the known processes (not additionally detailed here) of performing timing tests (e.g., setup, hold), identifying the paths that experience CPP among paths associated with failing tests, and determining a CPPR adjust value to credit back some time slack to those paths. Flagging post-CPPR critical paths, at block 320, includes flagging a node as "True" when the node is in the post-CPPR critical path of at least one downstream test. Table 1 shows pre-CPPR path slack, the CPPR adjust value, and the resulting post-CPPR path slack (pre-CPPR path slack+CPPR adjust value) for three exemplary paths A, B, and C. According to Table 1, the post-CPPR path slack for paths A and B is positive, while the post-CPPR path slack for path C is −1. Accordingly, path C is a critical post-CPPR path. In fact, the ordering of the paths in terms of criticality is that path C is the most critical, path A is the next critical, and path B is the least critical path (having the most positive path slack). Thus, according to an embodiment, all the nodes in path C would have their flag set to "True."

TABLE 1

Exemplary CPPR analysis values.

| Path | pre-CPPR path slack | CPPR adjust value | post-CPPR path slack (pre-CPPR path slack + CPPR adjust value) |
|---|---|---|---|
| A | −3 | 5 | +2 |
| B | −2 | 5 | +3 |
| C | −1 | 0 | −1 |

The CPPR adjust value for path C is 0. This may be because there may be no CPP in path C (path C is not common to both the data and clock paths associated with a test), for example. The determination of critical paths and the flagging (at block 320) may be performed according to alternate embodiments that are further discussed below.

At block 340, performing a fix includes making a design change to address the path or paths that have negative slack following the CPPR analysis (at block 310). As shown in FIG. 3, the post-CPPR critical paths (identified at block 320) may be used in performing the fix. Exemplary path C in Table 1 may be subjected to a fix, for example. Seeding the CPPR invalidation queue, at block 330, refers to identifying edges and nodes that satisfy at least one of the criteria shown in Table 2. The criteria relating to an edge (e.g., added, deleted) refers to the edge following the fix at block 340. Seeding the CPPR invalidation queue refers to identifying seed points according to Table 2. The seed points are nodes in post-CPPR critical paths that are associated with edges that satisfy at least one of the four conditions shown in Table 2.

TABLE 2

Criteria for invalidation of CPPR analysis.

| edge is added | AND | post-CPPR critical path flag set (sink) = True |
|---|---|---|
| edge is deleted | AND | post-CPPR critical flag set (source and sink) = True |
| edge arrival time (AT) is changed | AND | post-CPPR critical path flag set (sink) = True |
| edge required arrival time (RAT) is changed | AND | post-CPPR critical path flag set (source) = True |

As Table 2 indicates, the status of the edge (e.g., edge was added, deleted), as well as the status of the node at the source or sink (or both) of the edge, are considered in determining seed points to be added to the CPPR invalidation queue. The seed point itself is a node associated with one of the criteria in Table 2. At block 350, invalidating and re-calculating CPPR adjust values based on the seed points includes processing edges associated only with nodes in the fan-out cone of seed points determined at block 330. According to alternate embodiments discussed further below, even paths in the fan-out cone of the seed points may be further differentiated to determine which of them require invalidation and re-calculation of CPPR adjust values. The processing at block 350 can be limited to a subset of all the nodes, as discussed above, because of the recognition that a CPPR critical path cannot change if none of the conditions indicated in Table 2 are met. The CPPR critical path cannot change in terms of the CPPR adjust value or in terms of the ordering among paths leading to the end point. That is, if three different paths (e.g., paths A, B, and C shown in Table 1 above) lead to the same endpoint in the timing graph modeling the chip design, the path among those three that was determined as the CPPR critical path (e.g., path C in the example above) would remain the CPPR critical path if none of the conditions shown in Table 2 were met after a fix.

Figure 4:
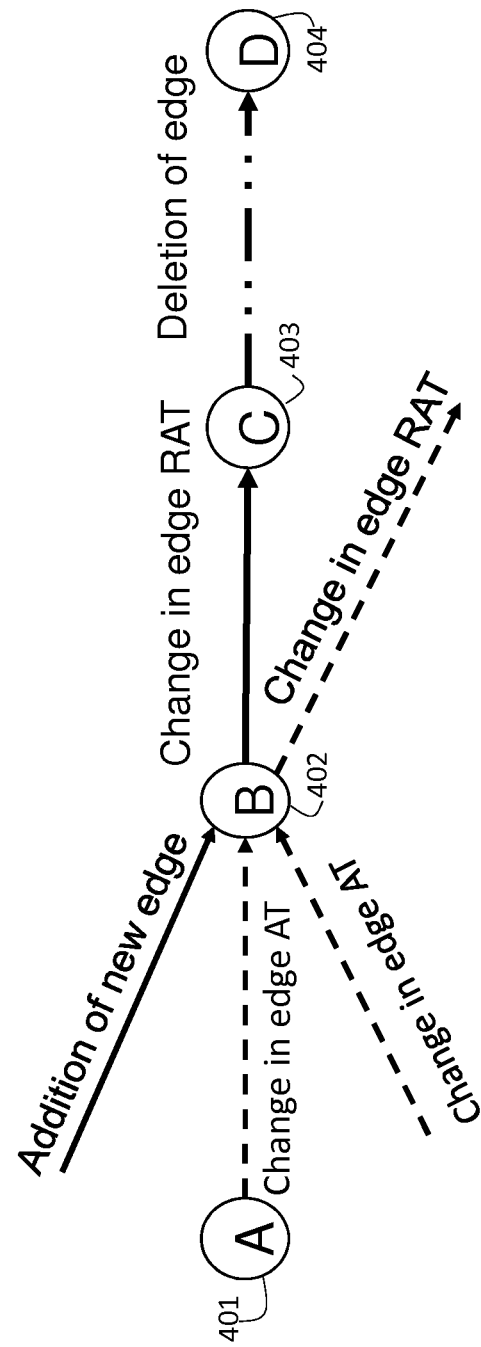
FIG. 4 is an exemplary computational thread to which processes shown in FIG. 3 are applied according to embodiments.

FIG. 4 is an exemplary computational thread 400 to which processes shown in FIG. 3 are applied according to embodiments. The thread 400 is a subset of the timing graph that models the chip design. Four nodes A 410, B 402, C 403, and D 404 are shown in FIG. 4. FIG. 4 also shows the disposition of edges associated with each of the nodes A 401, B 402, C 403, and D 404 after a fix. For explanatory purposes, it is assumed that the path A 401→B 402→C 403→D 404 is identified as a post-CPPR critical path and, thus, each of the nodes A 401, B 402, C 403, and D 404 is flagged with "True" at block 320 (FIG. 3). The exemplary edge addition, deletion, and changes shown in FIG. 4 may not all result from a given fix and are illustrative of the types of changes that may result from a fix. For explanatory purposes, all of the changes (addition, deletion, changes) shown are assumed to result from a fix. As FIG. 4 shows, node A 401 is at the source of an edge whose arrival time (AT) is changed, and B 402 is at the sink of the edge whose arrival time is changed. Node B 402 is at the sink of another edge whose arrival time is changed and at the sink of an edge that is added, as well. Thus, according to Table 2, any one of the three edges that terminate at node B 402 require that node B 402 (but not node A 401) is added to the CPPR invalidation queue (node B 402 is a seed point). Because nodes C 403 and D 404 are downstream of node B 402 and are in the fan-out cone of seed point B 402, the disposition of those nodes according to Table 2 is not relevant according to the present embodiment. However, nodes C 403 and D 404 are at the source and sink, respectively, of a deleted edge. Thus, according to Table 2, nodes C 403 and D 404 are also seed points. Accordingly, paths downstream of nodes B 402, C 403, and D 404 are invalidated and CPPR adjust is re-calculated for those paths (noting that paths downstream of D 404 are already downstream of nodes B 402 and C 403 and paths downstream of C 403 are already downstream of node B 402).

Figure 5:
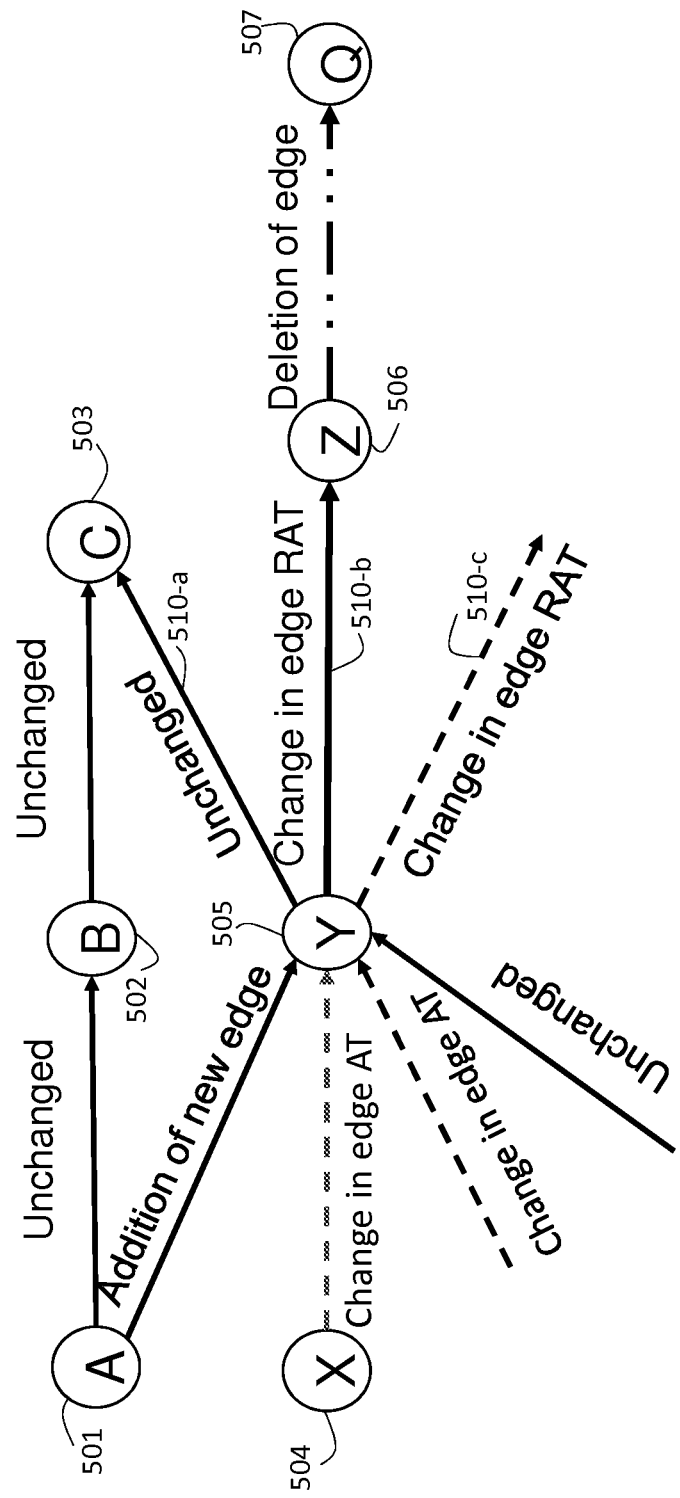
FIG. 5 is another exemplary computational thread to which processes shown in FIG. 3 are applied according to embodiments.

FIG. 5 is another exemplary computational thread 500 to which processes shown in FIG. 3 are applied according to embodiments. The thread 500 includes nodes A 501, B 502, C 503, X 504, Y 505, Z 506, and Q 507. For explanatory purposes, only the path A 501→B 502→C 503 is a post-CPPR critical path such that only nodes A 501, B 502, and C 503 are flagged "True" at block 320 (FIG. 3). Of those nodes—A 501, B 502, C 503—A 501 is the source of an added edge, and all the other edges associated with nodes A 501, B 502, and C 503 are unchanged. According to Table 2 above, none of the nodes A 501, B 502, or C 503 is a seed point. Node Y 505, for example, is a sink of an added edge, a sink of two edges with a changed arrival time (AT), and a source of two edges with a changed required arrival time (RAT). Any one of those conditions would qualify node Y 505 as a seed point if (and only if) node Y 505 were additionally flagged "True" at block 320 (node Y 505 were part of a post-CPPR critical path). That is, the first condition of Table 2 is satisfied but not the second (AND) condition. Because node Y 505 is not part of a post-CPPR critical path (and, thus, does not have the related flag set to "True"), node Y 505 is not a seed point, and paths in the fan-out cone of node Y 505 are not invalidated such that CPPR is re-calculated. Similarly, nodes Z 506 and Q 507 are at the source and sink, respectively, of a deleted edge. However, nodes Z 506 and Q 507 are not part of a post-CPPR critical path according to the example (their related flag is not set to "True" at block 320). Thus, according to the right side of Table 2, nodes Z 506 and Q 507 are not seed points. As noted above, none of the nodes A 501, B 502, or C 503 associated with the post-CPPR critical path A 501→B 402→C 503 is a seed point. As such, none of the paths shown in FIG. 5 would be invalidated according to an embodiment.

The embodiments discussed above may be applied to arrival time-based path tracing or slack-based tracing. That is, when a single corner (single set of conditions) is considered such that a single arrival time value is used at each node and a single delay is used through each edge, arrival time and slack will give the same result. This is illustrated for the exemplary component 101 in FIG. 1. On the other hand, when statistical static timing analysis or another approach considering multiple corners is used, then each arrival time and delay will have an early mode value and a late mode value, and slack-based path tracing (e.g., statistical path tracing (SPT)) and arrival time-based path tracing may give different results. These results would indicate which path (or paths) is critical, for example. However, regardless of the particular approach used to identify the post-CPPR critical path (or paths), the processes shown in FIG. 3 may be applied as further discussed below.

The processing at block 320 may be performed according to alternate embodiments. The determination of post-CPPR critical paths (that is, what nodes are eligible to be flagged), as well as the flagging of nodes in the post-CPPR critical paths (that is, how nodes are flagged), may be performed according to alternate embodiments. According to the embodiment discussed with reference to Table 1, each path (A, B, C) has a slack value associated with it. However, when multiple corners are considered and a statistical approach is taken, for example, each path slack may be associated with a probability. According to one alternate embodiment, more than one path related to the same end-point may be identified as a critical path. This identification may be based on a threshold slack probability or a threshold slack value, for example. In the exemplary case shown in Table 1, for example, both paths C and A may be considered to be post-CPPR critical paths based on a threshold post-CPPR path slack of +3. More than one path may be identified as a critical path based on a set number, for example. That is, the top N number of critical paths may be identified as post-CPPR critical paths.

As noted above, according to alternate embodiments, every node in a post-CPPR critical path may not have its flag set to "True." For example, early mode and late mode may be distinguished in the flagging process at block 320 (e.g., flag is set to [True, False] corresponding to {early mode, late mode} rather than just "True"). As such, if one of the modes is not relevant to a timing test of interest (e.g., early mode arrival time at a data node is not relevant in a setup test) and only the early mode flag is set to "True," the test will not unnecessarily be invalidated (the node will not be identified as a seed point). For example, the post-CPPR critical path flag may be set to [True, False] (for [early mode, late mode]) for a given node X, and one of the conditions of Table 2 may apply to X. According to this exemplary scenario, hold tests, which involve the early mode data in the fan-out cone of node X would be invalidated and re-calculated according to incremental CPPR analysis. However, setup tests, which involve the late mode data in the fan-out cone of node X would not be invalidated and need not be re-calculated. Flags at a node that is part of one or more post-CPPR critical paths may also be set according to endpoints. For example, node Y 505 in FIG. 5 is associated with endpoints C 503 and Q 507. If node Y 505 were part of a post-CPPR critical path for a test involving endpoint C 503, the flag for node Y 505 may be set such that the flag is "True" with respect to endpoint C 503 but set to "False" with respect to other endpoints, e.g., Q 507, for which Y 505 does not participate in a corresponding post CPPR critical path. Then, if Y 505 were set as a seed point, then C 503 would be re-calculated for CPPR analysis, but Q 507 would not. The disposition of the path associated with edge 510-*c* would depend on the flag setting at Y 505 with respect to the endpoint associated with edge 510-*c*.

According to yet another alternate embodiment, setting a post-CPPR critical path flag based on Table 2 may include additionally considering updated arrival time or required arrival time. That is, as Table 2 indicates, arrival time or required arrival time for an edge may change as part of a fix. In statistical timing, the order of CPPR path peeling can be a function of slack, which involves both arrival and required arrival times. Therefore, as a further embodiment, in addition to back-propagating end-point specific flags, as discussed above, a test-specific required arrival time may also be back-propagated. Doing so allows for determination of whether updates of the type "edge arrival time (AT) is changed" or "edge required arrival time (RAT) is changed"

in Table 2 actually cause the order of slack criticality to change among fan-in edges. According to this embodiment, in response to an AT change along an edge, CPPR analysis is only performed if the order of slack criticality changes, as determined by a back-propagated test RAT value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of performing incremental common path pessimism analysis in integrated circuit design, the method comprising:
    performing, using a processor, common path pessimism removal (CPPR) analysis to provide timing credit for one or more paths that are subject to common path pessimism;
    identifying one or more post-CPPR critical paths following the CPPR analysis that provides the timing credit to the one or more paths that are subject to common path pessimism;
    setting flags for critical nodes of the one or more post-CPPR critical paths;
    performing a design fix to address the one or more post-CPPR critical paths;
    applying a set of rules based on the design fix and the flags to identify seed points among the critical nodes of the one or more post-CPPR critical paths, wherein the identifying the seed points is by identifying the critical nodes that meet one or more of the following criteria: the critical node is a sink of an edge added as a result of the performing the design fix, the critical node is a source or sink of an edge deleted as a result of the performing the design fix, the critical node is a sink of an edge with a changed arrival time based on the performing the design fix, and the critical node is a source of an edge with a changed required arrival time based on the performing the design fix; and
    invalidating and re-performing the CPPR analysis only for paths in a fan-out cone from the seed points, wherein the integrated circuit design resulting from the incremental common path pessimism analysis is implemented as a physical implementation of an integrated circuit.

2. The computer-implemented method according to claim 1, wherein the identifying the one or more post-CPPR critical paths is based on post-CPPR path slack of the one or more post-CPPR critical paths.

3. The computer-implemented method according to claim 1, wherein the identifying the one or more post-CPPR critical paths is based on a threshold post-CPPR path slack.

4. The computer-implemented method according to claim 1, wherein the setting the flags includes flagging every critical node in each of the one or more post-CPPR critical paths.

5. The computer-implemented method according to claim 1, wherein the setting the flags includes setting two flags for every critical node in each of the one or more post-CPPR critical paths, the two flags associated with an early mode and a late mode.

6. The computer-implemented method according to claim 1, wherein the setting the flags includes setting one flag associated with each endpoint for every critical node in each of the one or more post-CPPR critical paths.

7. The computer-implemented method according to claim 1, wherein the invalidating and re-performing the CPPR analysis is performed only for paths in a fan-out cone of the seed points.

8. A system to perform incremental common path pessimism analysis in integrated circuit design, the system comprising:
    a memory device configured to store a set of rules; and
    a processor configured to perform common path pessimism removal (CPPR) analysis to adjust delay in one or more paths that are subject to common path pessimism, identify one or more post-CPPR critical paths following the CPPR analysis that provides timing credit to the one or more paths that are subject to common path pessimism, set flags for critical nodes of the one or more post-CPPR critical paths, perform a design fix to address the one or more post-CPPR critical paths, apply the set of rules based on the design fix and the flags to identify seed points among the critical nodes, and invalidate and re-perform the CPPR analysis only for paths in a fan-out cone from the seed points, wherein the processor identifies the seed points by identifying the critical nodes that meet one or more of the following criteria according to the set of rules: the critical node is a sink of an edge added as a result of the performing the design fix, the critical node is a source or sink of an edge deleted as a result of the performing the design fix, the critical node is a sink of an edge with a changed arrival time based on the performing the design fix, and the critical node is a source of an edge with a changed required arrival time based on the performing the design fix, wherein the integrated circuit design is implemented as a physical implementation of an integrated circuit.

9. The system according to claim 8, wherein the processor identifies the one or more post-CPPR critical paths based on post-CPPR path slack of the one or more post-CPPR critical paths.

10. The system according to claim 8, wherein the processor identifies the one or more post-CPPR critical paths based on a threshold post-CPPR path slack.

11. The system according to claim 8, wherein the processor sets the flags by flagging every critical node in each of the one or more post-CPPR critical paths.

12. The system according to claim 8, wherein the processor sets the flags by setting two flags for every critical node in each of the one or more post-CPPR critical paths, the two flags associated with an early mode and a late mode, or by setting one flag associated with each endpoint for every critical node in each of the one or more post-CPPR critical paths.

13. A computer program product for performing incremental common path pessimism analysis in integrated circuit design, the computer program product comprising a computer readable storage medium having program instructions embodied therewith, the program instructions executable by a processor to perform a method comprising:
performing common path pessimism removal (CPPR) analysis to adjust delay in one or more paths that are subject to common path pessimism;
identifying one or more post-CPPR critical paths following the CPPR analysis that provides timing credit to the one or more paths that are subject to common path pessimism;
setting flags for critical nodes of the one or more post-CPPR critical paths;
performing a design fix to address the one or more post-CPPR critical paths;
applying a set of rules based on the design fix and the flags to identify seed points among the critical nodes of the one or more post-CPPR critical paths, wherein the identifying the seed points is by identifying the critical nodes that meet one or more of the following criteria: the critical node is a sink of an edge added as a result of the performing the design fix, the critical node is a source or sink of an edge deleted as a result of the performing the design fix, the critical node is a sink of an edge with a changed arrival time based on the performing the design fix, and the critical node is a source of an edge with a changed required arrival time based on the performing the design fix; and
invalidating and re-performing the CPPR analysis only for paths in a fan-out cone from the seed points, wherein the integrated circuit design resulting from the incremental common path pessimism analysis is implemented as a physical implementation of an integrated circuit.

14. The computer program product according to claim 13, wherein the identifying the one or more post-CPPR critical paths is based on post-CPPR path slack of the one or more post-CPPR critical paths.

15. The computer-implemented method according to claim 13, wherein the identifying the one or more post-CPPR critical paths is based on a threshold post-CPPR path slack.

16. The computer program product according to claim 13, wherein the setting the flags includes flagging every critical node in each of the one or more post-CPPR critical paths, setting two flags for every critical node in each of the one or more post-CPPR critical paths, the two flags associated with an early mode and a late mode, or setting one flag associated with each endpoint for every critical node in each of the one or more post-CPPR critical paths.

17. The computer program product according to claim 13, wherein the invalidating and re-performing the CPPR analysis is performed only for paths in a fan-out cone of the seed points.

* * * * *